United States Patent
Kotani et al.

(10) Patent No.: US 11,440,318 B2
(45) Date of Patent: Sep. 13, 2022

(54) COATING LIQUID COMPOSITION FOR FORMING PIEZOELECTRIC FILM, ORIENTED PIEZOELECTRIC FILM, AND LIQUID EJECTION HEAD

(71) Applicant: CANON KABUSHIKI KAISHA, Tokyo (JP)

(72) Inventors: Yoshinori Kotani, Yokohama (JP); Motokazu Kobayashi, Yokohama (JP); Yoshihiro Ohashi, Tokyo (JP); Minako Nakasu, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 308 days.

(21) Appl. No.: 16/589,582

(22) Filed: Oct. 1, 2019

(65) Prior Publication Data
US 2020/0108607 A1 Apr. 9, 2020

(30) Foreign Application Priority Data
Oct. 3, 2018 (JP) .............................. JP2018-188388

(51) Int. Cl.
| | | |
|---|---|---|
| *B41J 2/14* | (2006.01) | |
| *H01L 41/08* | (2006.01) | |
| *H01L 41/187* | (2006.01) | |
| *H01L 41/331* | (2013.01) | |
| *H01L 41/318* | (2013.01) | |
| *B41J 2/16* | (2006.01) | |
| *C04B 35/624* | (2006.01) | |
| *C04B 35/468* | (2006.01) | |

(52) U.S. Cl.
CPC .......... *B41J 2/14233* (2013.01); *B41J 2/161* (2013.01); *B41J 2/1645* (2013.01); *C04B 35/4686* (2013.01); *C04B 35/624* (2013.01); *H01L 41/0805* (2013.01); *H01L 41/1871* (2013.01); *H01L 41/1873* (2013.01); *H01L 41/318* (2013.01); *H01L 41/331* (2013.01); *B41J 2002/14258* (2013.01); *C04B 2235/3236* (2013.01); *C04B 2235/441* (2013.01)

(58) Field of Classification Search
CPC .............. H01L 41/318; H01L 41/1871; H01L 41/1873; H01L 41/0805; H01L 41/331; B41J 2/14233; B41J 2/161; B41J 2/1645; C04B 35/624; C04B 35/4686; C04B 2235/441; C04B 2235/3236
See application file for complete search history.

(56) References Cited

U.S. PATENT DOCUMENTS

| | | | | |
|---|---|---|---|---|
| 4,516,140 A | * | 5/1985 | Durkee | B41J 2/14233 310/330 |
| 4,518,887 A | * | 5/1985 | Yano | B41J 9/38 346/139 C |
| 4,553,059 A | * | 11/1985 | Abe | F02M 57/02 310/341 |
| 2018/0269374 A1 | * | 9/2018 | Numazawa | H01L 41/1871 |

FOREIGN PATENT DOCUMENTS

| | | |
|---|---|---|
| JP | 2004-107180 A | 4/2004 |
| JP | 2011-230427 A | 11/2011 |
| JP | 2014-168056 A | 9/2014 |

OTHER PUBLICATIONS

Wataru Sakamoto; Toshinobu Yogo, "Effects of BaTiO3 Content and Mn Doping on Ferroelectric Properties of NaNbO3-BaTiO3 Thin Films Prepared by Chemical Solution Deposition," Jpn. J. Appl. Phys., 48 (2009) 09KA08-1-09KA08-5.

* cited by examiner

Primary Examiner — C Melissa Koslow
(74) Attorney, Agent, or Firm — Canon U.S.A., Inc., IP Division (57) ABSTRACT

A sodium niobate-barium titanate-based coating liquid composition including: (a) a sol-gel raw material containing (i) a niobium component, such as a niobium alkoxide, (ii) a sodium component, such as a sodium alkoxide, (iii) a titanium component, such as a titanium alkoxide, and (iv) a barium component, such as a barium alkoxide; and (b) a compound including at least one kind selected from the group consisting of a β-ketoester compound and a β-diketone compound represented by the following formula (1):

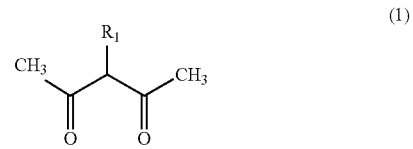

(1)

where $R_1$ represents an alkyl group having 1 or more to 6 or less carbon atoms.

5 Claims, 10 Drawing Sheets

COATING LIQUID COMPOSITION FOR FORMING PIEZOELECTRIC FILM, ORIENTED PIEZOELECTRIC FILM, AND LIQUID EJECTION HEAD

BACKGROUND OF THE INVENTION

Field of the Invention

The present disclosure relates to a coating liquid composition for forming a piezoelectric film, an oriented piezoelectric film, and a liquid ejection head.

Description of the Related Art

In recent years, a concern about an environmental load following disposal of various electronic devices each using a lead-containing dielectric thin film has led to a demand for a lead-free dielectric thin film. As a method of forming such film, a sol-gel method, which facilitates precise control of complicated film composition and allows a large-area substrate to be homogeneously coated, is drawing attention. As such lead-free dielectric thin film, hitherto, there has been disclosed a thin film obtained by forming a sodium niobate-barium titanate-based film (hereinafter sometimes referred to as "NNBT film") using the sol-gel method (for example, Effects of $BaTiO_3$ Content and Mn Doping on Ferroelectric Properties of $NaNbO_3$—$BaTiO_3$ Thin Films Prepared by Chemical Solution Deposition, Jpn. J. Appl. Phys., 48 (2009) 09KA08).

As an application of the dielectric thin film, it is known that the dielectric thin film can be suitably used as an actuator for an ink jet recording head or the like. In this case, however, a large piezoelectric constant is required. In general, a film having higher orientation tends to show a larger piezoelectric constant. Therefore, in order to enable use in such application, high orientation of a film to be obtained by coating is required as well as high stability of a coating liquid composition from the viewpoint of production.

However, a coating liquid composition disclosed in Effects of $BaTiO_3$ Content and Mn Doping on Ferroelectric Properties of $NaNbO_3$—$BaTiO_3$ Thin Films Prepared by Chemical Solution Deposition, Jpn. J. Appl. Phys., 48 (2009) 09KA08 has disadvantages in that the coating liquid composition has low stability and does not show high orientation as a film.

SUMMARY OF THE INVENTION

According to at least one aspect of the present disclosure, there are provided a sodium niobate-barium titanate-based coating liquid composition (hereinafter sometimes referred to as "NNBT coating liquid composition"), including: a) a sol-gel raw material containing: (i) at least one kind of niobium component selected from the group consisting of a niobium alkoxide, a hydrolysate of the niobium alkoxide, and a condensate of the hydrolysate of the niobium alkoxide; (ii) at least one kind of sodium component selected from the group consisting of a sodium alkoxide, a hydrolysate of the sodium alkoxide, and a condensate of the hydrolysate of the sodium alkoxide; (iii) at least one kind of titanium component selected from the group consisting of a titanium alkoxide, a hydrolysate of the titanium alkoxide, and a condensate of the hydrolysate of the titanium alkoxide; and (iv) at least one kind of barium component selected from the group consisting of a barium alkoxide, a hydrolysate of the barium alkoxide, and a condensate of the hydrolysate of the barium alkoxide; and (b) a compound including at least one kind selected from the group consisting of a β-ketoester compound and a β-diketone compound represented by the following general formula (1):

(1)

where $R_1$ represents an alkyl group having 1 or more to 6 or less carbon atoms, and a production method therefor.

In addition, according to at least one aspect of the present disclosure, there is provided a sodium niobate-barium titanate-based piezoelectric film including a perovskite crystal that has a crystal axis oriented in a normal direction of a film surface, and that is represented by the following general formula (2).

$$(1-x)NaNbO_3\text{-}xBaTiO_3 \quad (0.01 \le x \le 0.40) \qquad (2)$$

Further features of the present disclosure will become apparent from the following description of exemplary embodiments with reference to the attached drawings.

DESCRIPTION OF THE EMBODIMENTS

An aspect of the present disclosure is to obtain a coating liquid composition having high stability, and to provide a piezoelectric film, more specifically an NNBT film that is oriented to a specific crystal plane when coating with such coating liquid composition is performed, followed by drying and sintering thereof.

Now, embodiments of the present disclosure are described in detail.

<Sodium Niobate-Barium Titanate-Based Coating Liquid Composition and Production Method Therefor>

An NNBT coating liquid composition according to at least one embodiment of the present disclosure contains as an essential component (i) at least one kind of niobium component selected from the group consisting of a niobium alkoxide, a hydrolysate of the niobium alkoxide, and a condensate of the hydrolysate of the niobium alkoxide. In addition, the NNBT coating liquid composition according to at least one embodiment of the present disclosure contains as an essential component (ii) at least one kind of sodium component selected from the group consisting of a sodium alkoxide, a hydrolysate of the sodium alkoxide, and a condensate of the hydrolysate of the sodium alkoxide. In addition, the NNBT coating liquid composition according to at least one embodiment of the present disclosure contains as an essential component (iii) at least one kind of titanium component selected from the group consisting of a titanium alkoxide, a hydrolysate of the titanium alkoxide, and a condensate of the hydrolysate of the titanium alkoxide. In addition, the NNBT coating liquid composition according to at least one embodiment of the present disclosure contains as an essential component (iv) at least one kind of barium component selected from the group consisting of a barium alkoxide, a hydrolysate of the barium alkoxide, and a condensate of the hydrolysate of the barium alkoxide. The NNBT coating liquid composition according to at least one embodiment of the present disclosure includes a sol-gel raw material containing the components (i) to (iv).

Further, the NNBT coating liquid composition according to at least one embodiment of the present disclosure includes a compound including at least one kind selected from the group consisting of a β-ketoester compound and a β-diketone compound represented by the following general formula (1):

(1)

where $R_1$ represents an alkyl group having 1 or more to 6 or less carbon atoms.

As raw material compounds for metal oxides in the NNBT coating liquid composition, respective metal alkoxides, hydrolysates thereof, condensates thereof, or salt compounds, such as chlorides or nitrates, of respective metals may be used. From the viewpoints of the stability of the coating liquid composition and film homogeneity at the time of film formation, metal alkoxides are preferably used as raw materials.

Specific examples of the niobium alkoxide include pentamethoxyniobium, pentaethoxyniobium, penta-i-propoxyniobium, penta-n-propoxyniobium, penta-i-butoxyniobium, and penta-n-butoxyniobium. Examples of the sodium alkoxide include methoxysodium, ethoxysodium, i-propoxysodium, n-propoxysodium, i-butoxysodium, n-butoxysodium, and sec-butoxysodium. Examples of the titanium alkoxide include tetramethoxytitanium, tetraethoxytitanium, tetra-n-propoxytitanium, tetraisopropoxytitanium, tetra-n-butoxytitanium, and tetraisobutoxytitanium. Examples of the barium alkoxide include dimethoxybarium, diethoxybarium, di-i-propoxybarium, di-n-propoxybarium, di-i-butoxybarium, di-n-butoxybarium, and di-sec-butoxybarium.

In at least one embodiment of the present disclosure, a compositional ratio between a sodium niobate component and a barium titanate component is, for example, from 0.99:0.01 to 0.60:0.40 in terms of molar ratio. In addition, a molar ratio between niobium and sodium in sodium niobate is from 1:0.8 to 1:1.2, and is preferably, for example, from 1:0.9 to 1:1.1. Similarly, a molar ratio between titanium and barium in barium titanate is from 1:0.8 to 1:1.2, and is preferably, for example, from 1:0.9 to 1:1.1.

When those metal alkoxide raw materials are used, because of high reactivity thereof to water, the metal alkoxide raw materials are abruptly hydrolyzed by moisture in the air or addition of water to cause clouding or precipitation in a solution.

In order to prevent such phenomenon, it is preferred that a stabilizer be added to stabilize the solution. Examples of the stabilizer include β-ketoester compounds, such as methyl acetoacetate, ethyl acetoacetate, allyl acetoacetate, benzyl acetoacetate, iso-propyl acetoacetate, tert-butyl acetoacetate, iso-butyl acetoacetate, and 2-methoxyethyl acetoacetate. In addition, examples of the stabilizer include β-diketone compounds each represented by the general formula (1), such as 3-methyl-2,4-pentanedione and 3-ethyl-2,4-pentanedione. In addition, acetylacetone, which is one of the β-diketone compounds, is effective from the viewpoint of the stability of the solution, but is not preferred from the viewpoint of the orientation of the film to be obtained. The addition amount of the stabilizer is set to preferably from 0.1 to 3, more preferably from 0.5 to 2 in terms of molar ratio with respect to the total amount of the metal alkoxides. When the stabilizer is added as just described, the stability of the coating liquid can be enhanced.

In addition, the β-ketoester compound or the β-diketone compound serving as the stabilizer is considered to be coordinate-bonded to the metal element of each of the metal alkoxides, and the coating liquid composition according to at least one embodiment of the present disclosure has a feature of containing a niobium alkoxide precursor, a sodium alkoxide precursor, a titanium alkoxide precursor, and a barium alkoxide precursor under a state in which the stabilizer coordinates to form a chelate with the metal of each of the metal alkoxides.

The metal alkoxides and the stabilizer are dissolved in an organic solvent to prepare the coating liquid composition. The addition amount of the organic solvent is preferably set to from 20-fold moles to 30-fold moles with respect to the total molar amount of the metal alkoxides.

As the organic solvent, there is used, for example, an alcohol, a carboxylic acid, an aliphatic or alicyclic hydrocarbon, an aromatic hydrocarbon, an ester, a ketone, an ether, a chlorinated hydrocarbon, or an aprotic polar solvent, or a mixed solvent of two or more kinds thereof.

Preferred examples of the alcohol include methanol, ethanol, 2-propanol, butanol, 2-methoxyethanol, 2-ethoxyethanol, 1-methoxy-2-propanol, 1-ethoxy-2-propanol, 1-propoxy-2-propanol, 4-methyl-2-pentanol, 2-ethylbutanol, 3-methoxy-3-methylbutanol, ethylene glycol, diethylene glycol, and glycerin.

Preferred specific examples of the carboxylic acid to be used include n-butyric acid, α-methylbutyric acid, i-valeric acid, 2-ethylbutyric acid, 2,2-dimethylbutyric acid, 3,3-dimethylbutyric acid, 2,3-dimethylbutyric acid, 3-methylpentanoic acid, 4-methylpentanoic acid, 2-ethylpentanoic acid, 3-ethylpentanoic acid, 2,2-dimethylpentanoic acid, 3,3-dimethylpentanoic acid, 2,3-dimethylpentanoic acid, 2-ethylhexanoic acid, and 3-ethylhexanoic acid.

Preferred specific examples of the aliphatic or alicyclic hydrocarbon include n-hexane, n-octane, cyclohexane, cyclopentane, and cyclooctane.

Preferred examples of the aromatic hydrocarbon include toluene, xylene, and ethylbenzene.

Preferred examples of the ester include ethyl formate, ethyl acetate, n-butyl acetate, ethylene glycol monomethyl ether acetate, ethylene glycol monoethyl ether acetate, and ethylene glycol monobutyl ether acetate.

Preferred examples of the ketone include acetone, methyl ethyl ketone, methyl isobutyl ketone, and cyclohexanone.

Preferred examples of the ether include dimethoxyethane, tetrahydrofuran, dioxane, and diisopropyl ether.

Preferred examples of the chlorinated hydrocarbon include chloroform, methylene chloride, carbon tetrachloride, and tetrachloroethane.

Examples of the aprotic polar solvent include N-methylpyrrolidone, dimethylformamide, dimethylacetamide, and ethylene carbonate.

In the preparation of the coating liquid composition to be used in at least one embodiment of the present disclosure, of the above-mentioned various solvents, an alcohol is preferably used from the viewpoint of the stability of the solution. Further, it is more preferred to use an alcohol and a carboxylic acid in combination.

A production method for the sodium niobate-barium titanate-based coating liquid composition according to at least one embodiment of the present disclosure has a feature of including the steps of: adding the at least one kind selected from the group consisting of the β-ketoester compound and the β-diketone compound serving as the stabilizer to the organic solvent to prepare a first preparation liquid; and adding the niobium alkoxide, the sodium alkoxide, the titanium alkoxide, and the barium alkoxide to the first preparation liquid, followed by reflux.

The preparation method for the coating liquid composition desirably involves, for example, mixing the above-mentioned metal alkoxides into a solution obtained by adding the stabilizer to the organic solvent, and then subjecting the mixture to a reaction under heating in the temperature range of from 80° C. to 200° C. for from 2 hours to 10 hours, that is, refluxing the mixture.

In addition, as required, water or a catalyst is preferably added to partially hydrolyze alkoxyl groups in advance. Examples of the catalyst may include nitric acid, hydrochloric acid, sulfuric acid, phosphoric acid, acetic acid, and ammonia. Accordingly, the coating liquid composition according to at least one embodiment of the present disclosure may contain hydrolysates of the metal alkoxides or condensates thereof.

In addition, a water-soluble organic polymer may be added as required. Examples of the organic polymer include polyethylene glycol, polypropylene glycol, and polyvinylpyrrolidone. The addition amount of the organic polymer is preferably set to fall within the range of from 0.1 mass % to 10 mass % with respect to the oxide of the film.

In the formation of the film using the coating liquid composition, an atmosphere in which coating is to be performed is preferably an inert gas atmosphere, such as dry air or dry nitrogen. The relative humidity of a dry atmosphere is preferably set to 30% or less.

Further, as a coating method for the coating liquid composition, a known coating method, such as a dipping method, a spin coating method, a spraying method, a printing method, a flow coating method, or a combination thereof, may be appropriately adopted. A film thickness may be controlled by changing a lifting speed in the dipping method, a substrate rotation speed in the spin coating method, or the like, and changing the concentration of the coating liquid composition.

<Sodium Niobate-Barium Titanate-Based Piezoelectric Film and Production Method Therefor>

A substrate on which a sodium niobate-barium titanate-based piezoelectric film (NNBT film) according to at least one embodiment of the present disclosure is to be formed varies depending on its applications, but for example, a heat-resistant substrate, such as a silicon substrate or a sapphire substrate, having formed thereon a lower electrode is used. As the lower electrode to be formed on the substrate, a material that has conductivity and does not react with the NNBT film according to at least one embodiment of the present disclosure, such as Pt or Ir, is used. In addition, for example, a substrate having the lower electrode formed through the intermediation of a bonding layer, an insulator film, or the like on the substrate may be used. A specific example thereof is a substrate having a laminated structure of Pt/Ti/SiO$_2$/Si, Pt/TiO$_2$/SiO$_2$/Si, Pt/Ir/SiO$_2$/Si, or Pt/IrO/Ir/SiO$_2$/Si (lower electrode/bonding layer/insulator film/substrate).

After a coating film has been formed on the substrate, the coating film is calcined and sintered to be crystallized. The calcination is performed using a hot plate, an infrared condensing furnace (RTA), or the like, under predetermined conditions. The calcination is performed in order to remove the solvent and thermally decompose or hydrolyze the metal compounds to cause their conversion into a complex oxide, and hence is desirably performed in air, in an oxidizing atmosphere, or in a water vapor-containing atmosphere. Even in heating in air, moisture required for hydrolysis is sufficiently secured by moisture in the air. Before the calcination, in order to remove particularly a low-boiling point component and adsorbed water molecules, low-temperature heating may be performed using a hot plate or the like at a temperature of from 60° C. to 200° C. for from 1 minute to 20 minutes. The calcination is preferably performed at a temperature of from 400° C. to 600° C. for from 1 minute to 20 minutes. With regard to steps from the coating with the coating liquid composition to the calcination thereof, when a desired film thickness is obtained by one time of the coating, the steps from the coating to the calcination are performed once before the sintering is performed. Alternatively, the steps from the coating to the calcination may be repeated a plurality of times so as to achieve a desired film thickness, followed finally by sintering in one batch. A film thickness obtained by one time of the coating is from 50 nm to 500 nm, and when the calcination temperature is low, the film thickness is preferably small. The sintering is a step for sintering the coating film after the calcination at a temperature equal to or higher than its crystallization temperature to crystallize the coating film, and thus the NNBT film according to at least one embodiment of the present disclosure is obtained. The sintering atmosphere of the crystallizing step is suitably, for example, oxygen, nitrogen, argon, or the like, or a mixed gas thereof. The sintering is preferably performed by keeping the coating film at from 800° C. to 1,100° C. for from 1 minute to 60 minutes. The sintering may be performed by rapid thermal annealing treatment (RTA treatment). The rate of temperature increase from room temperature to the above-mentioned sintering temperature is preferably set to from 10° C./second to 100° C./second.

With the use of the coating liquid composition according to at least one embodiment of the present disclosure, the NNBT film according to at least one embodiment of the present disclosure is obtained through the above-mentioned steps. The resultant NNBT film has a feature in that a perovskite crystal represented by the following general formula (2):

$$(1-x)\text{NaNbO}_3\text{-}x\text{BaTiO}_3 \quad (0.01 \leq x \leq 0.4) \qquad (2)$$

has a crystal axis oriented in a normal direction of a film surface. The NNBT film according to at least one embodiment of the present disclosure has a Pt electrode, an Ir electrode, or the like as a substrate base, and is epitaxially oriented along the (111) surface of the metal electrode, to thereby provide a (111)-oriented film.

A mechanism by which the film is (111)-oriented is presumably as described below, though not necessarily bound by the following theory. That is, it is considered that the escape of the stabilizer from the metal alkoxides and the timing of a crystal nucleation stage affect the orientation of the film. When the coordinating ability of the stabilizer contained in the coating liquid composition according to at least one embodiment of the present disclosure is low, the stabilizer easily escapes, and crystal nucleation easily proceeds at a crystal nucleation stage involved in the sintering process of the film, and hence the film is epitaxially oriented along the (111) surface of the substrate base, such as a Pt electrode or an Ir electrode, with the result that the (111)-oriented film is obtained. With this, a piezoelectric property can be expected to be improved.

<Liquid Ejection Head>

A liquid ejection head according to at least one embodiment of the present disclosure includes a liquid ejection orifice, a pressure chamber communicating with the liquid ejection orifice, and an actuator configured to cause a capacity change for ejecting a liquid from the liquid ejection orifice to the pressure chamber, wherein the actuator includes: a vibrating plate; a lower electrode; a piezoelectric film formed of a barium titanate-based film formed on a substrate; and an upper electrode, which are arranged in the stated order from the pressure chamber side.

Figure 7:
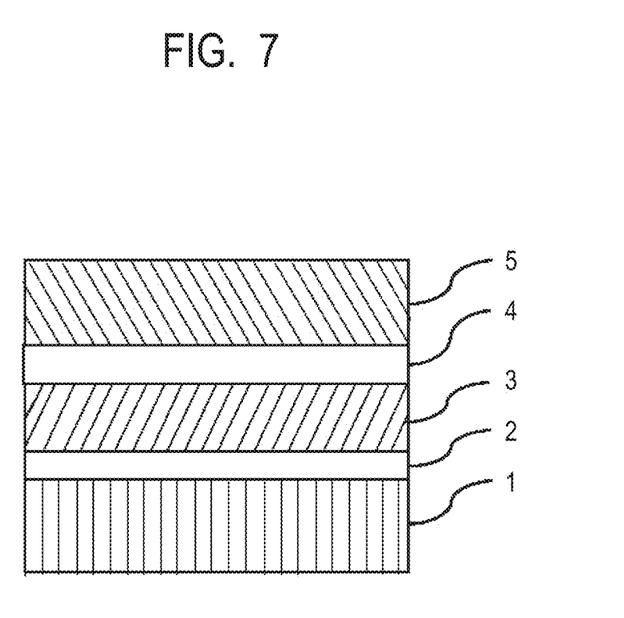
FIG. 7 is a longitudinal cross-sectional schematic view for illustrating a piezoelectric actuator according to at least one embodiment.

As the actuator to be used in at least one embodiment of the present disclosure, there is given such a longitudinal cross-sectional schematic view as illustrated in FIG. 7. In FIG. 7, there are illustrated a base substrate 1 configured to support a piezoelectric thin film, an intermediate layer 2, a lower electrode 3, an orientation control layer 4, and a piezoelectric layer 5.

The base substrate 1 contains $SiO_2$ as a material for at least its outermost layer, and as another material for the base substrate 1, a material free from deforming or melting even when a thermal load is applied thereto in a drying step after coating, is preferred. In addition, it is preferred that the base substrate 1 have a smooth surface, be capable of preventing the diffusion of elements at the time of heat treatment, and also have sufficient mechanical strength. In addition, in the production of the liquid ejection head through the use of a piezoelectric thin film formed of the NNBT film obtained according to at least one embodiment of the present disclosure, the base substrate 1 may double as a pressure chamber substrate for forming a pressure chamber. For example, for such purpose, a semiconductor substrate formed of silicon (Si) having its surface layer turned to a film of $SiO_2$ by thermal oxidation may be preferably used, but a ceramic, such as zirconia, alumina, or silica, may be used. In addition, as long as the outermost layer is made of $SiO_2$, those materials may be used in combination thereof or laminated to be used as a multi-layer configuration.

The intermediate layer 2 is optionally arranged as a layer for serving a function of bonding the base substrate 1 and the lower electrode 3 to each other. For example, Pt serving as the lower electrode and $SiO_2$ of the outermost layer of the base substrate alone provide a weak bonding property, and besides, degrade the crystallinity of each of the Pt film and the piezoelectric layer to be formed thereon, with the result that satisfactory piezoelectric performance is not obtained in some cases. In addition, also when the thickness of the intermediate layer is excessively large, a disadvantage arises. When the thickness of the intermediate layer is more than 50 nm, the crystallinity of the piezoelectric layer serving as an upper layer tends to be degraded. Therefore, the intermediate layer preferably has a thickness of from 5 nm to 50 nm. A material for the intermediate layer 2 is preferably Ti or a Ti oxide typified by $TiO_2$.

A material for the lower electrode 3 is a conductive layer having a thickness of from 5 nm to 2,000 nm, and examples thereof for a piezoelectric element may generally include metals such as Ti, Pt, Ta, Ir, Sr, In, Sn, Au, Al, Fe, Cr, and Ni, and oxides thereof. Of those, Pt, which is a metal that provides a (111)-oriented surface on which the piezoelectric film is to be formed, is preferred. In addition, as a method of forming the electrode, there are given some methods, such as a sol-gel method, a sputtering method, and a vapor deposition method. Of those, formation by a sputtering method is most preferred because the electrode can be formed without the application of temperature. The thickness of the electrode is not particularly limited as long as the thickness allows conductivity to be obtained, but is desirably from 10 nm to 1,000 nm. In addition, the formed electrode may be patterned into a desired shape before use.

The orientation control layer 4 is a layer configured to control the orientation of the piezoelectric film to be laminated thereon, and is formed of a sodium niobate-barium titanate-based oxide. The layer has an effect of controlling a surface on which the piezoelectric film to be formed on the layer grows. Besides, Ti of the intermediate layer present between the lower electrode and the base substrate is also diffused into the electrode and the piezoelectric film owing to a thermal load, but the interposition of the orientation control layer also has a suppressing effect on the diffusion of Ti. The film thickness of the orientation control layer is preferably 5 nm or more to 100 nm or less. However, in at least one embodiment of the present disclosure, the orientation of the piezoelectric film is controlled by the orientation of the lower electrode 3, and hence when the control of the orientation of the piezoelectric film is to be adversely affected, the layer may not be particularly arranged.

As a material for the piezoelectric layer 5, a sodium niobate-barium titanate-based piezoelectric film formed using the coating liquid according to at least one embodiment of the present disclosure is used.

Figure 8:
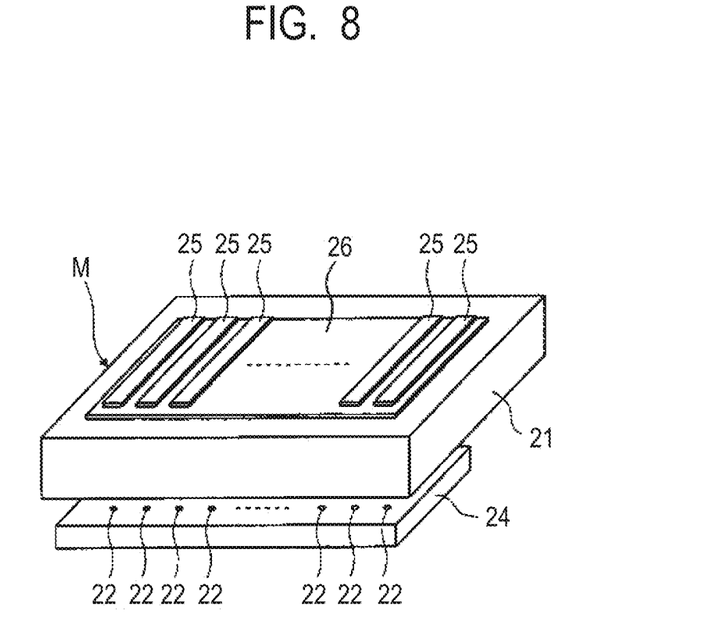
FIG. 8 is a schematic perspective view for illustrating a liquid ejection head according to at least one embodiment.
Figure 9:
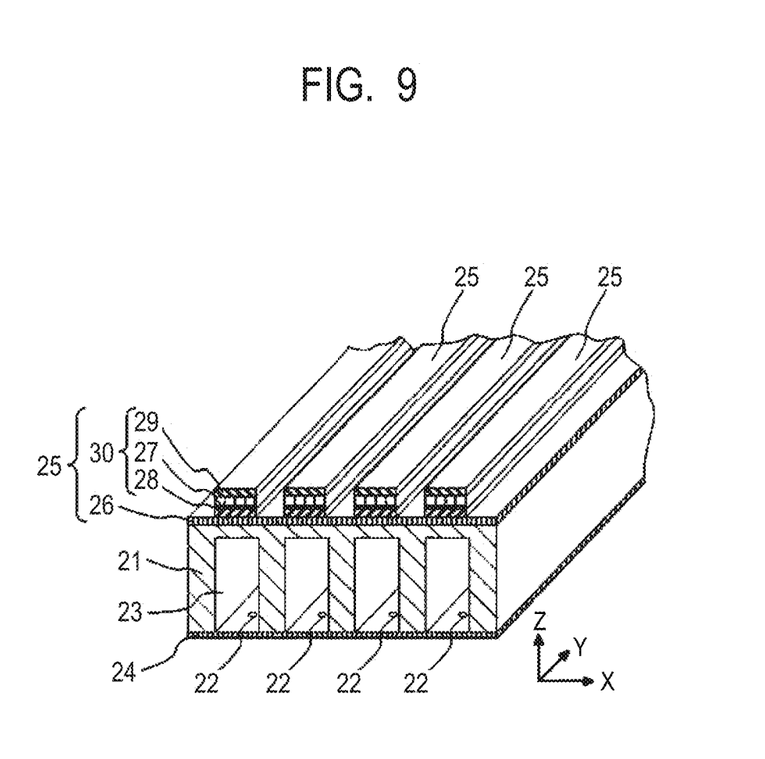
FIG. 9 is a schematic perspective cross-sectional view for illustrating the liquid ejection head according to at least one embodiment.
Figure 10:
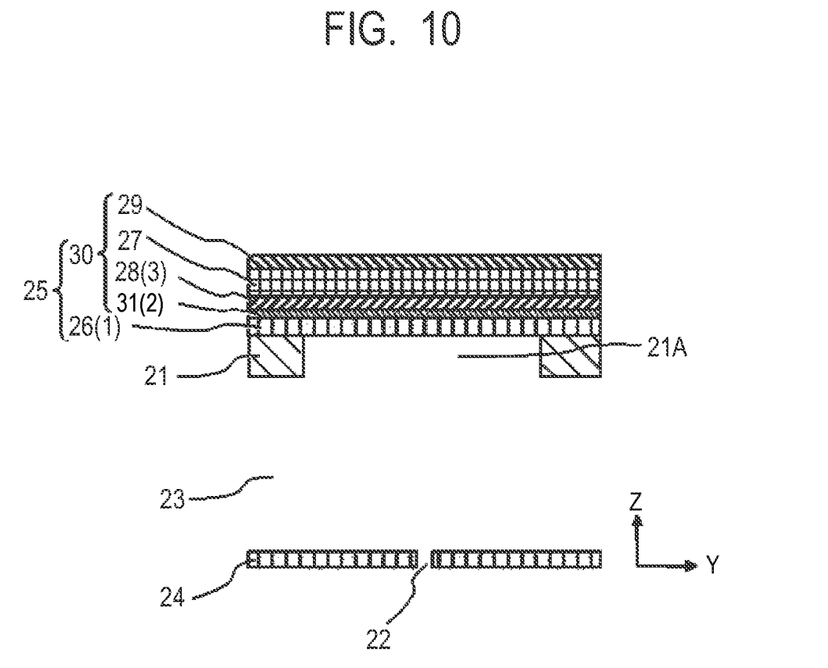
FIG. 10 is a schematic cross-sectional view for illustrating the liquid ejection head according to at least one embodiment.

As the liquid ejection head to be used in at least one embodiment of the present disclosure, there is given one including a piezoelectric film as illustrated in FIG. 8 to FIG. 10. This liquid ejection head M includes: a substrate 21 for a liquid ejection head; a plurality of liquid ejection orifices 22; a plurality of pressure chambers 23; and actuators 25 arranged so as to respectively correspond to the pressure chambers 23. The pressure chambers 23 are arranged to respectively correspond to the liquid ejection orifices 22, and communicate with the liquid ejection orifices 22. The actuators 25 are each configured to cause, through its vibration, a capacity change of a liquid in the pressure chamber 23, to thereby cause the liquid to be ejected from each of the liquid ejection orifices 22. The liquid ejection orifices 22 are formed in a nozzle plate 24 at predetermined intervals, and the pressure chambers 23 are formed parallel to each other in the substrate 21 for a liquid ejection head so as to respectively correspond to the liquid ejection orifices 22. The liquid ejection orifices 22 are arranged on the lower surface side of the actuators 25 in at least one embodiment of the present disclosure, but may be arranged on the side surface side of the actuators 25. On the upper surface of the substrate 21 for a liquid ejection head, openings (not shown) respectively corresponding to the pressure chambers 23 are formed, and the actuators 25 are arranged so as to respectively cover the openings. Each of the actuators 25 is formed of a vibrating plate 26 and a piezoelectric element 30, and the piezoelectric element 30 includes a piezoelectric film 27, an intermediate layer 31, and a pair of electrodes (a lower electrode 28 and an upper electrode 29). A material for the vibrating plate 26 is not particularly limited, but is preferably a semiconductor, such as Si, a metal, a metal oxide, glass, or the like. The piezoelectric element 30 and the vibrating plate 26 may be formed by bonding or adhesion, or with the use of the vibrating plate 26 as a substrate, the lower electrode 28 and the piezoelectric element 30 may be formed directly on the substrate. Further, the vibrating plate 26 may be formed directly on the substrate 21 for a liquid ejection head.

An example of the liquid to be used in at least one embodiment of the present disclosure may be ink, and an example of the liquid ejection head may be an ink jet recording head.

EXAMPLES

The present disclosure is more specifically described below by way of Examples and Comparative Examples.

However, the present disclosure is not limited to the following Examples.

Cross-sectional observation of coating films of Examples was performed using a scanning electron microscope (trade name: "FESEM S-4800", manufactured by Hitachi, Ltd.) at an acceleration voltage of 5 kV. The resolution of the scanning electron microscope used was 1.0 nm (acceleration voltage: 15 kV, working distance: 4 mm) or 2.0 nm (acceleration voltage: 1 kV, working distance: 1.5 mm).

Orientation color mapping and inverse pole figure orientation mapping of films of Examples and Comparative Examples were performed using a scanning electron microscope (trade name: "SEM, Quanta FEG 250", manufactured by FEI) and an electron backscatter diffraction analyzer (trade name: "TSL-EBSD system", manufactured by TSL Solutions).

In addition, the piezoelectric constant d31 of each of coating films of Examples and Comparative Examples was measured by depositing gold as an upper electrode from the vapor, and using a vibrometer based on a noncontact laser Doppler method (trade name: "Laser Vibrometer LV-1800", manufactured by Ono Sokki Co., Ltd.).

(Example 1) Preparation of Coating Liquid Composition 1

Niobium ethoxide, sodium ethoxide, barium di-i-propoxide, and titanium n-butoxide were dissolved in a solution obtained by adding ethyl acetoacetate serving as a stabilizer to a mixed solvent of 2-methoxyethanol, 3-methoxymethylbutanol, and 2-ethylhexanoic acid. After that, the solution was refluxed for about 8 hours. Thus, a coating liquid composition 1 was prepared. The molar ratios in the solution were set as follows: 2-methoxyethanol:3-methoxymethylbutanol: 2-ethylhexanoic acid:ethyl acetoacetate:niobium ethoxide:sodium ethoxide:barium di-i-propoxide:titanium n-butoxide=12:8:3:1:0.95:0.95:0.05:0.05.

(Example 2) Production of Coating Film 1

Figure 1:
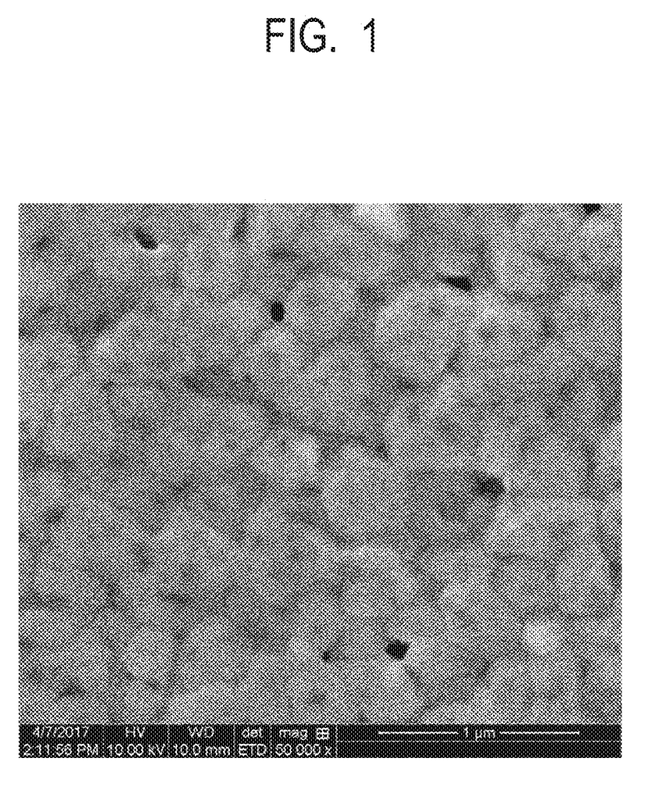
FIG. 1 is an electron micrograph of a surface of a film obtained in Example 2.
Figure 2:
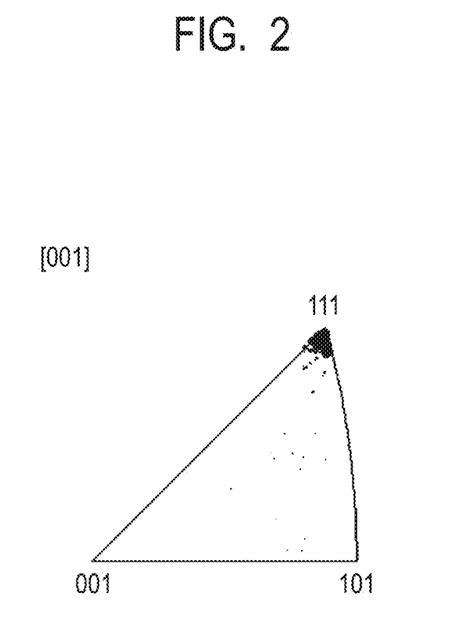
FIG. 2 is an inverse pole figure obtained by electron backscatter diffraction analysis measurement of the film obtained in Example 2.

The coating liquid composition 1 prepared in Example 1 was used to form a film on a Pt/SiO$_2$/Si substrate by a spin coating method. The resultant was subjected to heat treatment on a hot plate set to 150° C. for 10 minutes, and then to heat treatment in an infrared heating furnace at 600° C. for 10 minutes. The coating and the calcination were repeated 10 times, followed finally by sintering in an infrared heating furnace at 1,000° C. for 10 minutes, to provide a sodium niobate-barium titanate-based piezoelectric film. A surface SEM photograph of the resultant sodium niobate-barium titanate-based piezoelectric film is shown in FIG. 1. Its film thickness was about 700 nm. In addition, an inverse pole figure obtained by the electron backscatter diffraction analysis measurement of the resultant film is shown in FIG. 2. In FIG. 2, it is found that measurement points are mostly concentrated on the (111) surface.

Further, observation was performed based on an orientation color map obtained by the electron backscatter diffraction analysis measurement of the sodium niobate-barium titanate-based piezoelectric film. In the resultant orientation color map, regions of a color representing the (111) surface occupied almost the entire surface.

It was found from the foregoing that the sodium niobate-barium titanate-based piezoelectric film obtained in Example 2 was almost completely (111)-oriented. In addition, the piezoelectric constant d31 of the coating film 1 obtained in Example 2 was −8.1 pm/V.

(Example 3) Preparation of Coating Liquid Composition 2

A coating liquid composition was prepared by the same method as that of Example 1 with the exception that 3-methyl-2,4-pentanedione was used as the stabilizer.

(Example 4) Production of Coating Film 2

Figure 3:
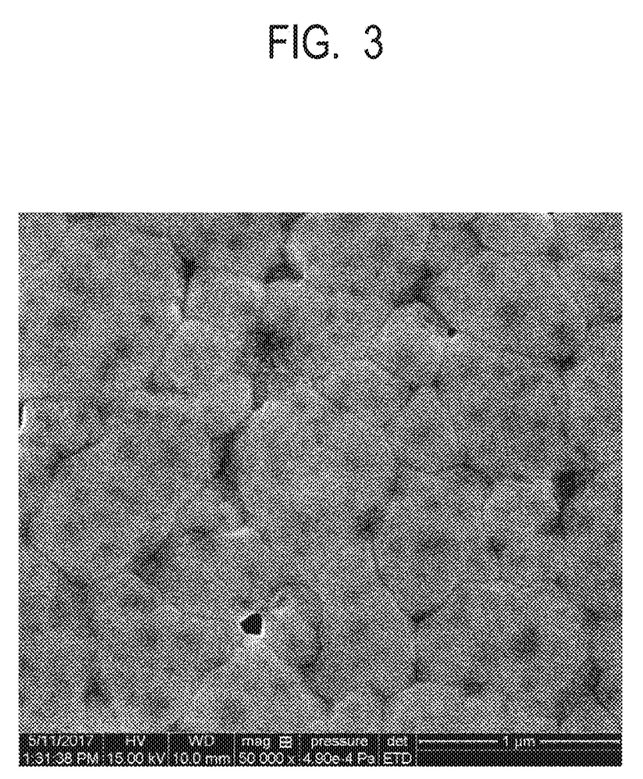
FIG. 3 is an electron micrograph of a surface of a film obtained in Example 4.
Figure 4:
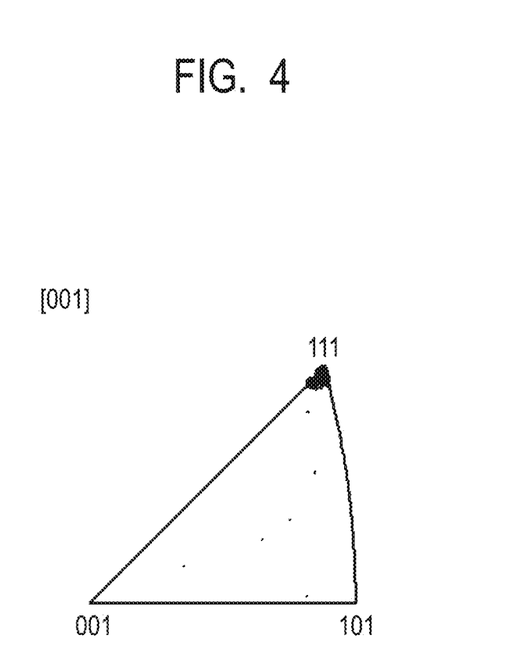
FIG. 4 is an inverse pole figure obtained by electron backscatter diffraction analysis measurement of the film obtained in Example 4.

With the use of the coating liquid composition 2 prepared in Example 3, a sodium niobate-barium titanate-based piezoelectric film was produced in the same manner as in Example 2. A surface SEM photograph of the resultant sodium niobate-barium titanate-based piezoelectric film is shown in FIG. 3. In addition, an inverse pole figure obtained by the electron backscatter diffraction analysis measurement of the resultant film is shown in FIG. 4. In FIG. 4, it is found that measurement points are mostly concentrated on the (111) surface.

Further, observation was performed based on an orientation color map obtained by the electron backscatter diffraction analysis measurement of the sodium niobate-barium titanate-based piezoelectric film. In the resultant orientation color map, regions of a color representing the (111) surface occupied almost the entire surface.

It was found from the foregoing that the sodium niobate-barium titanate-based piezoelectric film obtained in Example 4 was almost completely (111)-oriented.

(Comparative Example 1) Preparation of Coating Liquid Composition 3

A coating liquid composition was prepared by the same method as that of Example 1 with the exception that acetylacetone was used as the stabilizer.

(Comparative Example 2) Production of Coating Film 3

Figure 5:
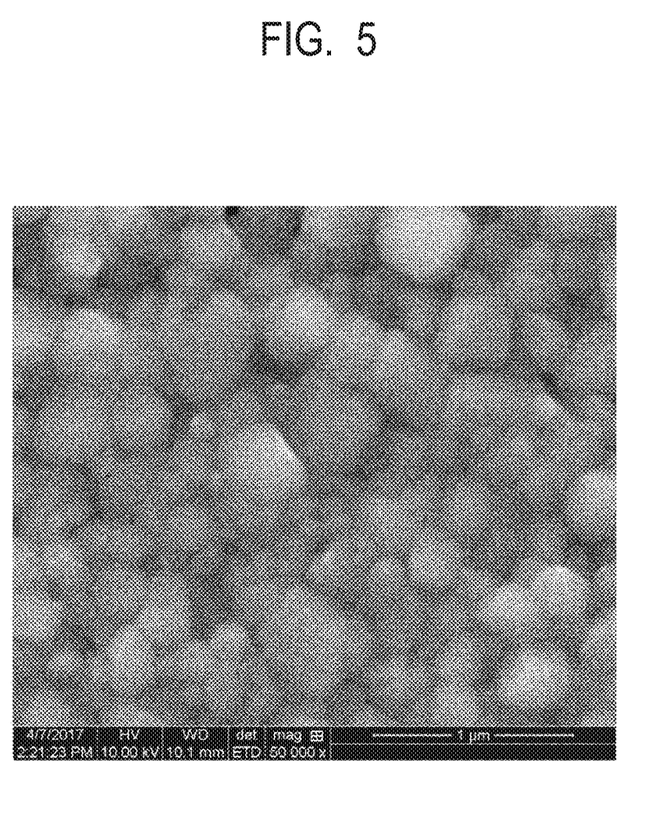
FIG. 5 is an electron micrograph of a surface of a film obtained in Comparative Example 2.
Figure 6:
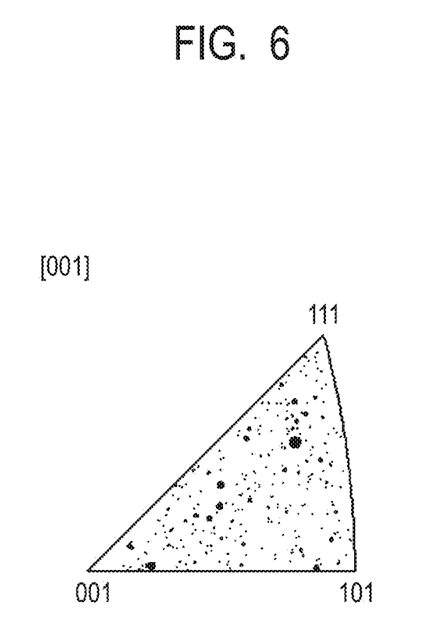
FIG. 6 is an inverse pole figure obtained by electron backscatter diffraction analysis measurement of the film obtained in Comparative Example 2.

With the use of the coating liquid composition 3 prepared in Comparative Example 1, a film was produced in the same manner as in Example 2. A surface SEM photograph of the resultant film is shown in FIG. 5. In addition, an inverse pole figure obtained by the electron backscatter diffraction analysis measurement of the resultant film is shown in FIG. 6. In FIG. 6, it is found that measurement points are scattered all over the figure.

Further, observation was performed based on an orientation color map obtained by the electron backscatter diffraction analysis measurement of the sodium niobate-barium titanate-based piezoelectric film. In the resultant orientation color map, several colors were sparsely scattered.

It was found from the foregoing that the film obtained in Comparative Example 2 was randomly oriented. In addition, the piezoelectric constant d31 of the coating film 3 obtained in Comparative Example 2 was −5.8 pm/V.

Thus, it was found that the piezoelectric constant d31 of the coating film 1 obtained in Example 2 was about 1.5 times as large as the piezoelectric constant d31 of the coating film 3 obtained in Comparative Example 2, and hence the piezoelectric constant was improved.

According to at least one aspect of the present disclosure, the NNBT film preferentially oriented to a specific crystal plane is obtained, and the coating liquid composition having high liquid stability can be provided.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-188388, filed Oct. 3, 2018, which is hereby incorporated by reference herein in its entirety.

What is claimed is:

1. A sodium niobate-barium titanate-based coating liquid composition comprising:
    (a) a sol-gel raw material containing:
    (i) at least one kind of niobium component selected from the group consisting of a niobium alkoxide, a hydrolysate of the niobium alkoxide, and a condensate of the hydrolysate of the niobium alkoxide;
    (ii) at least one kind of sodium component selected from the group consisting of a sodium alkoxide, a hydrolysate of the sodium alkoxide, and a condensate of the hydrolysate of the sodium alkoxide;
    (iii) at least one kind of titanium component selected from the group consisting of a titanium alkoxide, a hydrolysate of the titanium alkoxide, and a condensate of the hydrolysate of the titanium alkoxide; and
    (iv) at least one kind of barium component selected from the group consisting of a barium alkoxide, a hydrolysate of the barium alkoxide, and a condensate of the hydrolysate of the barium alkoxide; and
    (b) a compound including at least one member selected from the group consisting of a β-ketoester compound and a β-diketone compound represented by the following formula (1):

(1)

where $R_1$ represents an alkyl group having 1 or more to 6 or less carbon atoms.

2. The sodium niobate-barium titanate-based coating liquid composition according to claim 1, further comprising an alkoxide precursor in which the β-ketoester compound or the β-diketone compound coordinates to form a chelate with at least one member selected from the group consisting of the niobium alkoxide, the sodium alkoxide, the titanium alkoxide, and the barium alkoxide.

3. The sodium niobate-barium titanate-based coating liquid composition according to claim 2, wherein the compound (b) is dissolved in at least one organic solvent selected from the group consisting of an alcohol and a carboxylic acid.

4. The sodium niobate-barium titanate-based coating liquid composition according to claim 1, wherein the compound (b) is dissolved in at least one organic solvent selected from the group consisting of an alcohol and a carboxylic acid.

5. A liquid ejection head comprising:
    a liquid ejection orifice;
    a pressure chamber communicating with the liquid ejection orifice; and
    an actuator configured to cause a capacity change for ejecting a liquid from the liquid ejection orifice to the pressure chamber,
    wherein the actuator includes:
    a vibrating plate;
    a sodium niobate-barium titanate-based piezoelectric film comprising a perovskite crystal that has a crystal axis oriented in a normal direction of a film surface, and that is represented by the following general formula (2):

$$(1-x)\text{NaNbO}_3\text{-}x\text{BaTiO}_3 \quad (0.01 \leq x \leq 0.40) \qquad (2);$$

an upper electrode; and
a lower electrode located between the vibrating plate and the sodium niobate-barium titanate-based piezoelectric film, and
wherein the vibrating plate, the sodium niobate-barium titanate-based piezoelectric film, and the upper electrode are arranged in this order from a pressure chamber side.

* * * * *